United States Patent [19]

Nagakubo et al.

[11] 4,363,696
[45] Dec. 14, 1982

[54] SHORT CIRCUIT PREVENTION IN THE MANUFACTURE OF SEMICONDUCTOR DEVICES

[75] Inventors: Yoshihide Nagakubo, Kawasaki; Hisakazu Iizuka, Yokohama, both of Japan

[73] Assignee: Tokyo Shibaura Denki Kabushiki Kaisha, Japan

[21] Appl. No.: 258,415

[22] Filed: Apr. 28, 1981

[30] Foreign Application Priority Data

Jun. 25, 1980 [JP] Japan ................................. 55/85068

[51] Int. Cl.³ .................... H01L 21/283; H01L 21/308
[52] U.S. Cl. ...................................... 156/653; 29/591; 156/643; 156/656; 156/657; 156/662; 357/59
[58] Field of Search ............... 156/643, 653, 656, 657, 156/662; 29/591; 357/59

[56] References Cited

U.S. PATENT DOCUMENTS

| 4,076,575 | 2/1978 | Chang | 156/656 |
| 4,123,565 | 10/1978 | Sumitomo et al. | 156/657 |
| 4,142,926 | 3/1979 | Morgan | 357/59 |
| 4,172,004 | 10/1979 | Alcorn et al. | 156/643 |
| 4,184,909 | 1/1980 | Chang et al. | 156/656 |

OTHER PUBLICATIONS

'Tapering of . . . electrodes', Research Disclosure (4/81), No. 204, pp. 146-148.

*Primary Examiner*—Jerome W. Massie
*Attorney, Agent, or Firm*—Finnegan, Henderson, Farabow, Garrett & Dunner

[57] ABSTRACT

A first level interconnection layer of substantially a given width is formed on an insulating film on a semiconductor substrate. At least two second level interconnection layers, which cross the first level interconnection layer on another insulating layer, are formed. In a step for forming the first level interconnection layer, projections are formed at each side of the first level interconnection layer between the crossings of the second level interconnection layers. The total width of the first level interconnection layer including the width of the projection is larger than the given width. After the second level interconnection layers are formed, the projections of the first level interconnection layer are removed along with any second level interconnection layer material remaining intermediate the second level interconnection layers, thereby to prevent short-circuiting between the second level interconnection layers.

13 Claims, 15 Drawing Figures

SHORT CIRCUIT PREVENTION IN THE MANUFACTURE OF SEMICONDUCTOR DEVICES

BACKGROUND OF THE INVENTION

The present invention relates to a manufacturing method of semiconductor devices and more particularly to a manufacturing method of semiconductor devices of the type in which interconnection layer groups are arranged in the form of multilayers.

Integrated semiconductor devices become more fine, and the interconnection layer groups are multilayered. Because of this tendency, the upper and lower interconnection layers cross with an insulating layer interposed therebetween, resulting in the crowding of the connection layer group with step portions on the upper portion of the semiconductor device. In order to form such an interconnection layer group by patterning, it is preferable to use an anisotropic etching method, e.g. a reactive ion etching (RIE) process. When such an anisotropic etching method is used, however, the etching progresses only in the direction vertical to the surface of the semiconductor substrate, but does not progress in a lateral direction in parallel with the surface of the semiconductor substrate. Accordingly, when a first level interconnection layer is formed on an insulating layer on a semiconductor substrate and a second level interconnection layer is formed crossing the first level interconnection layer with another insulation layer intervening therebetween, conductive material from forming the second level interconnection layer is left at each side end of the first level interconnection layer between the two crossing portions, and the conductive material left short-circuits the two adjacent second level interconnection layers. This problem will be described with reference to FIGS. 1 and 2. In FIG. 1, numeral 11 designates an insulating oxide layer formed on a semiconductor substrate 10. After a polycrystalline silicon film is formed on the oxide layer 11, this film is subjected to the patterning to form a polycrystalline silicon interconnection layer 12 of a first layer group or first level. Then, the oxide film corresponding to the element region is etched away with a mask of the polycrystalline silicon interconnection layer 12. In the next step, to form a polycrystalline silicon interconnection layer 14 of a second layer group or second level, an insulating layer 13 must be provided between the first and second level interconnection layers 12 and 14. To this end, the first level interconnection layer 12 is oxidized to form an insulating layer 13 of several hundreds Å in thickness. FIG. 2 shows a cross section taken along line 2—2 of FIG. 1. After the formation of the insulating film 13, the polycrystalline silicon layer 14 of the second level must be formed by patterning a polycrystalline silicon film provided over the entire surface. As shown in FIG. 2, overhang portions 15 are formed on both the sides of the insulating film 13 when the first level interconnection layer 12 is oxidized. The polycrystalline silicon material coated over the entire surface for forming the second level interconnection layer 14, as a matter of course, enters under the overhang portions 15. In the patterning for the second level interconnection layer 14, as the RIE process is performed, the polycrystalline silicon material 14a under the overhang portions 15 is left, as shown in FIG. 2, without being removed. The residual polycrystalline silicon material 14a short-circuits between the second level interconnection layers 14. In the step of the patterning for forming the second level interconnection layer 14, if the isotropic etching is adapted, the polycrystalline material 14a is not left but use of the isotropic etching is problematic in the RIE method which is essential to the fine patterning.

Accordingly, an object of the present invention is to provide a method of manufacturing semiconductor devices which multilays interconnection layers by the antisotropic etching process, increases the integration density of circuit components, and improves the yield of products.

SUMMARY OF THE INVENTION

A manufacturing method of semiconductor devices according to this invention comprises a step for forming at least one first level interconnection layer with a given width on a first insulating layer and a step for forming at least two second level interconnection layers which cross the first level interconnection layer through a second insulating layer. The method further comprises steps of forming a projection at least at a location of each side end of the first level interconnection layer between the crossing portions of the first and second level interconnection layers when the first level interconnection layer is formed. The provision of the projection makes the width of the first level interconnection layer including the width of the projection to exceed the given width and removing at least a part of the projection so as to prevent the short-circuiting between the second level interconnection layers, after the formation of the second level interconnection layers.

When the present invention is applied to the manufacture of a semiconductor integrated circuit, fine, multilayered interconnection layers can easily be formed without any danger of short-circuiting between the interconnection layers. Therefore, the present invention provides a semiconductor device with improved reliability and yield of production.

BRIEF DESCRIPTION OF THE DRAWINGS

FIG. 1 is a plan view of a part of the semiconductor device, and

FIG. 2 is a cross sectional view taken along line 2—2 of FIG. 1, omitting a second level interconnection layer;

DETAILED DESCRIPTION OF THE PREFERRED EMBODIMENTS

Figure 1:
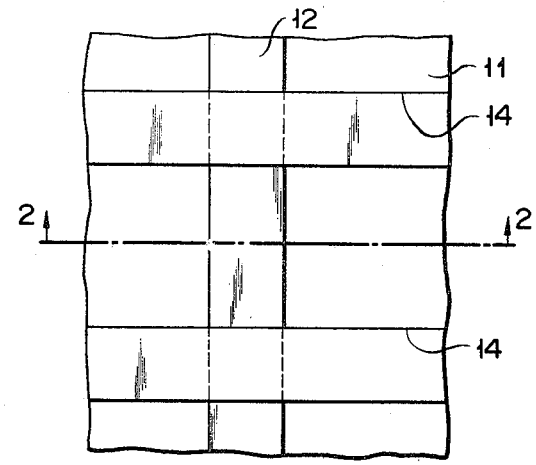
FIGS. 1 and 2 are for illustrating problems arising from the multilayered interconnection arrangement of a semiconductor device.
Figure 2:
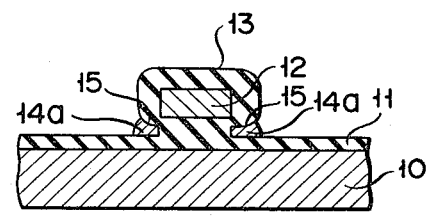
Figure 3:
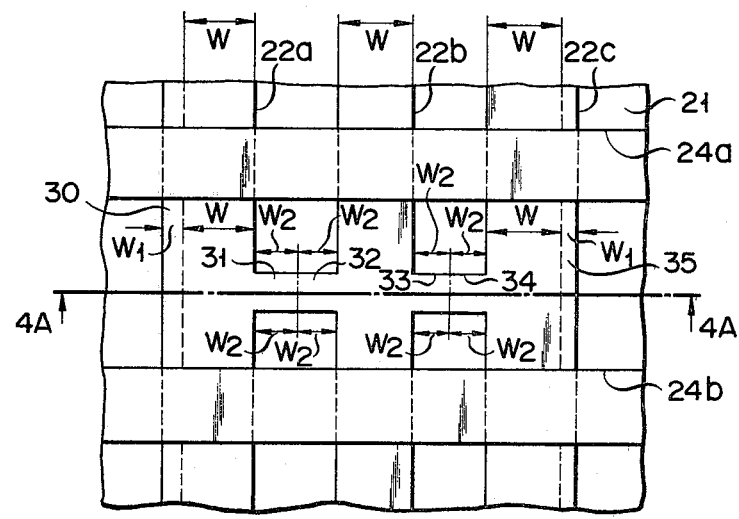
FIG. 3 is a plan view for illustrating a part of the manufacturing process according to the present invention.

An embodiment of a manufacturing method of semiconductor devices according to the present invention will be described with reference to FIG. 3 and FIGS. 4A to 4J. In FIG. 3, an oxide layer 21 is provided on a semiconductor substrate 20. Disposed on the oxide film 21 are first level interconnection layers 22a, 22b and 22c. Further layered on those first level interconnection layers are second level interconnection layers 24a and 24b crossing the first level interconnection layers through an insulating layer. Each of the first level interconnection layers 22a to 22c, after the final process step, has a width W. In the present embodiment, the interconnection layers are made of polycrystalline silicon. In the first step of forming the first level interconnection layers 22a to 22c, the interconnection layer 22a has a projection 30 having a width $W_1$ at the left side and a projection 31 having a width $W_2$ at the right side. The interconnection layer 22b has a projection 32 having a width $W_2$ at the left side and a projection 33 having a width $W_2$ at the right side. The interconnection layer 22c has a projection 34 having a width $W_2$ at the right side and a projection having a width $W_1$ at the left side. The projections 31 and 32, and 33 and 34 are continuous, respectively. Part of each of the projections is etched away, after the formation of the second level interconnection layers 24a and 24b, to prevent short-circuiting between the second level interconnection layers 24a and 24b. It will be understood that, in FIG. 3, although not illustrated, semiconductor devices to be connected to the interconnection layers are actually formed.

Figure 4A:
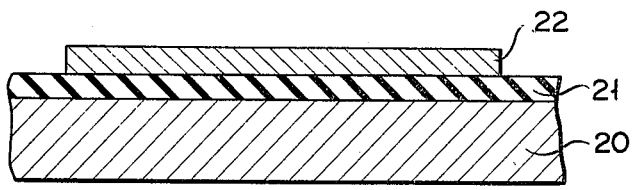
FIGS. 4A to 4J are cross sectional views, taken along line 4A—4A in FIG. 3, for illustrating a sequence of steps of a manufacturing method of semiconductor devices according to the present invention.
Figure 4B:
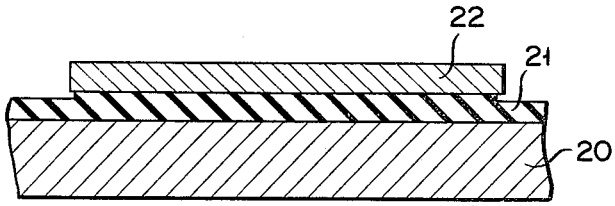
Figure 4C:
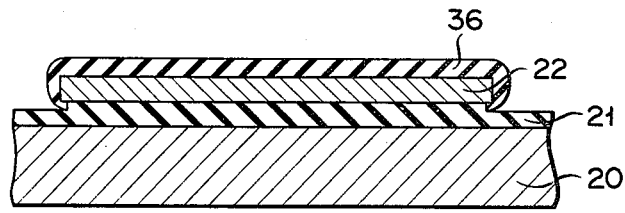

The manufacturing method of semiconductor devices according to the present invention will be described referring to the cross sectional views in FIGS. 4A to 4J, which are taken along line 4A—4A in FIG. 3. A field oxide layer or a gate oxide layer 21 is formed on a semiconductor substrate 20 by a known manner. Then, the first level interconnection layers 22a to 22c having projections 30 to 35 and made of polycrystalline silicon are formed by a known manner (FIGS. 3 and 4A), as a result, the polycrystalline silicon layer 22 is contained in the 4A—4A cross section. In the next step, an oxide film 21 in those region in which semiconductor elements are formed is selectively etched away by using ammonium floride $NH_4F$, for example, using as a mask the first level interconnection layers 22a to 22c. The result of this process step is illustrated in FIG. 4B. In order to form an insulating separation layer for separating the first level interconnection layers 22a to 22c from the second layer interconnection layers 24a and 24b, the first level interconnection layers 22a to 22c are thermally oxidized to form a thermal oxide layer 36 of 0.1 $\mu$m in thickness (FIG. 4C).

Figure 4D:
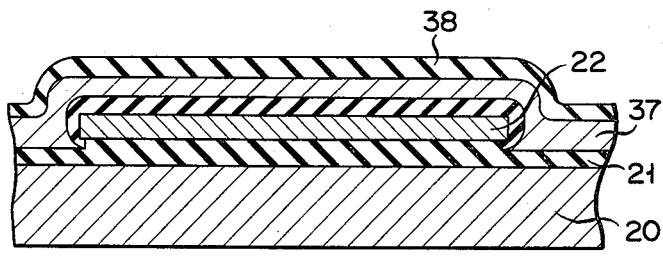
Figure 4E:
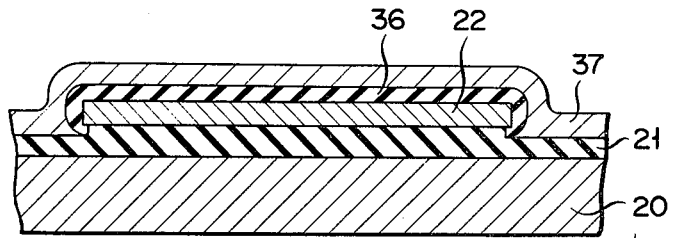

Then, a polycrystalline silicon film 37 is layered over the entire surface including the region in which the second level interconnection layers 24a and 24b are to be formed. To reduce resistance of the polycrystalline silicon layer 37, phosphorus is doped thereinto by the thermal diffusion process. Then, the polycrystalline silicon film 37 is oxidized to form an oxide film 38 of approximately 1000 Å in thickness (FIG. 4D). That area of the oxide film 38 where the second level interconnection layers 24a and 24b are to be formed is covered with photoresist (not shown), and oxide film 38 in areas other than that for the second level interconnection layers 24a and 24b is removed by the photo etching process (FIG. 4E).

Figure 4F:
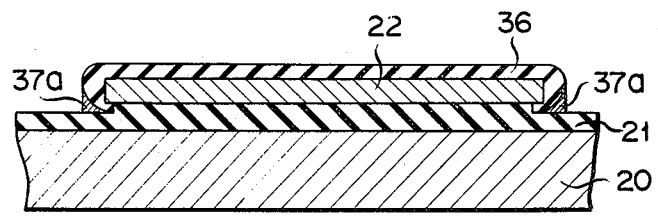
Figure 4G:
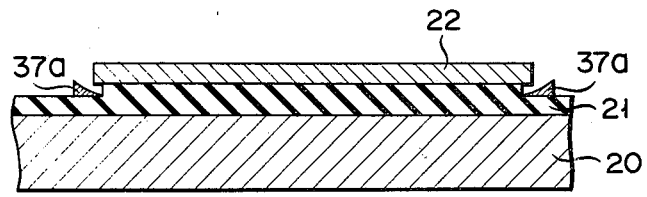

In the subsequent step, the polycrystalline silicon film other than that defined by the second interconnection layers 24a and 24b is etched away by the RIE method with a mask of the photoresist layer (FIG. 4F). By using the photoresist on the second level interconnection layers 24a and 24b as a mask, the insulating layer 36 is etched away by ammonium fluoride ($NH_4F$), for example (FIG. 4G). Then, the photoresist left on the second level interconnection layers 24a and 24b is removed. It is to be noted that, as shown in FIG. 4G, the polycrystalline silicon 37a used when the second level interconnection layers 24a and 24b are formed is left under the overhang portions of the insulating separation layer 36 shown in FIG. 4F. The polycrystalline silicon 37a short-circuits between the second level interconnection layers 24a and 24b.

Figure 4H:
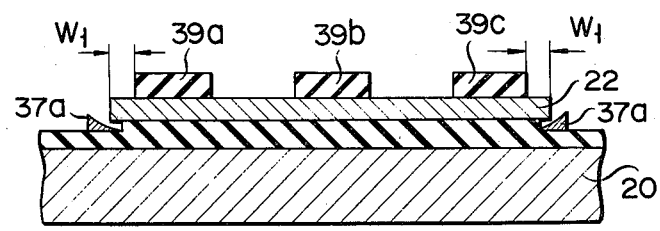

Photoresist films 39a to 39c are formed by the photo etching process on those regions where the first level interconnection layers 22a to 22c with width W are formed (FIG. 4H). The widths of the photoresist films 39a to 39c are selected to be equal to the width W of the first level interconnection layers 22a to 22c finally formed. In FIG. 4H, the left end of the photoresist film 39a is patterned so as to be positioned at a position shifted to the right by $W_1$ from the left end of the first level polycrystalline silicon interconnection layer 22a (FIG. 3) formed in the step of FIG. 4A. The right end of the photoresist film 39c is patterned so as to be positioned at a position shifted to the left by $W_1$ from the right end of the first level polycrystalline interconnection layer 22c formed in the step of FIG. 4A. The photoresist film 39b is patterned to have the width equal to the width of the first level interconnection layer 22b shown in FIG. 3.

Figure 4I:
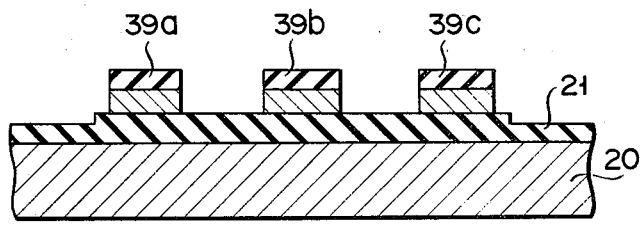

Following the step of FIG. 4H, the essential part of the first level polycrystalline silicon interconnection layer is masked by the photoresist films 39a to 39c and the unnecessary part of the first level polycrystalline interconnection layers are removed by the RIE method by the aid of the photoresist masks 39a to 39c (FIG. 4I). The residual polycrystalline silicon 37a left in the process shown in FIG. 4H is completely removed in the process shown in FIG. 4I. The projections 31 and 32 interconnecting the first level interconnection layers 22a and 22b and the projections 33 and 34 interconnecting the first level interconnection layers 22b and 22c, are completely removed in the step of FIG. 4I. Therefore, the short-circuiting between the second level polycrystalline silicon interconnection layers 24a and 24b is completely prevented.

Figure 4J:
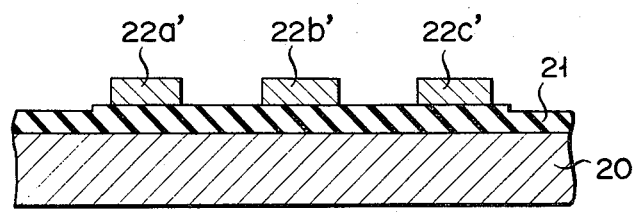

The photoresist films 39a to 39c are removed in a known manner (FIG. 4J). The first interconnection layers 22a', 22b' and 22c' in FIG. 4J have each width W shown in FIG. 3. The subsequent necessary process steps are performed according to the known technique.

In the prior manufacturing method, when the first level interconnection layers 22a to 22c are formed, those layers are formed to have the final width, for example, W. When the second level interconnection layers 24a and 24b are formed, the polycrystalline silicons 37a at the side ends of the first level interconnection layers 22a to 22c are removed by the isotropic etching process. But, the isotropic etching is insufficient for a high precision patterning.

The above embodiment is an example where the first and second level interconnection layers are provided, but it is evident that the present invention is applicable for a semiconductor device with interconnection layers of N (N≧3) levels. In this case, it is assumed that, of those layers N, the nth layer and the (n+1)th layer are formed by the manufacturing method according to the present invention. More specifically, projections corresponding to those of W1 and W2 shown in FIG. 3 are previously provided at the sides of the nth level interconnection layer between the crossing parts of the nth level interconnection layer and the (n+1)th level interconnection layer. After the formation of the (n+1)th level interconnection layer, at least part of the projections of the nth level interconnection layer is removed. Although the above-mentioned embodiment employs the RIE method for the etching of the interconnection layers, other anisotropic etching method, for example, the ion beam etching method may be employed.

Figure 5:
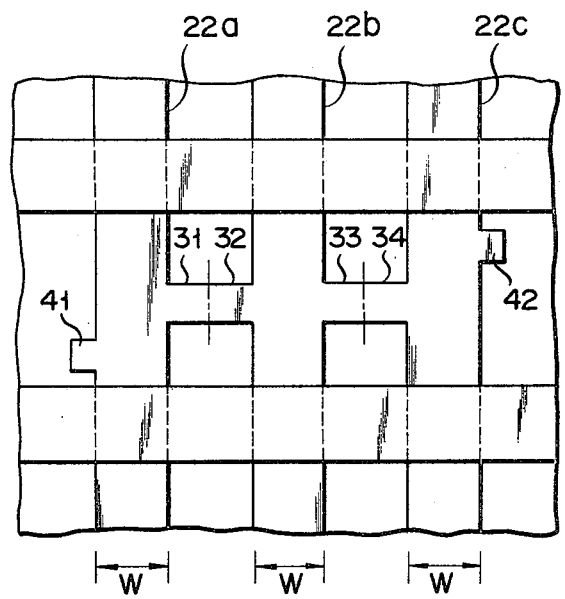
FIG. 5 is a plan view of a modification of the process step shown in FIG. 3.

As shown in FIG. 5, the projection 31 is formed at the right side of the first level interconnection layer 22a; the projection 32 at the left side of the first level interconnection layer 22b; the projection 33 at the right side of the first level interconnection layer 22b; the projection 34 at the left side of the first level interconnection layer 22c (as in the case of FIG. 3); a projection 41 at the left side of the first level interconnection layer 22a; a projection 42 at the right side of the first level interconnection layer 22a. With this configuration, the width of the first level interconnection layers 22a to 22c may be set, in the step of FIG. 4A, to the width left in the final step.

Figure 6:
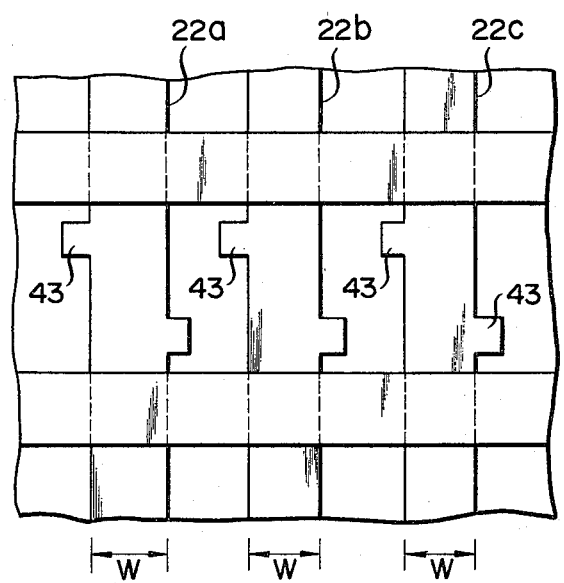
FIG. 6 is a plan view of another modification of the process step shown in FIG. 3.

Alternatively, as shown in FIG. 6, projections 43 are alternately formed on both sides of the first level interconnection layers 22a to 22c and those layers are arranged such that the projections of the adjacent first level interconnection layers are shifted longitudinally. This arrangement increases the density of the interconnection layers.

What we claim is:

1. A manufacturing method of semiconductor devices including a step for forming at least one first interconnection layer with a given width on a first insulating layer and a step for forming at least two second interconnection layers which cross said first interconnection layer on a second insulating layer, said manufacturing method comprising:

a first step for forming an underlying interconnection layer including said first interconnection layer on said first insulating layer, said underlying interconnection layer having projected portions at both sides of said interconnection layer of said given width, at least a part of each projected portion being removed subsequently;

a second step for selectively etching said first insulating layer with said underlying interconnection layer as a mask;

a third step for forming said second insulating layer;

a fourth step for forming a conductive layer on the entire surface, including said underlying interconnection layer, for forming said second interconnection layers;

a fifth step for covering said second interconnection layers with a first etching resist layer;

a sixth step for removing said conductive layer covering said entire surface, except in that region corresponding to said second interconnection layers, by an anisotropic etching method with said first etching resist layer as a mask;

a seventh step for removing said second insulating layer with said second interconnection layers as a mask, a part of said conductive layer remaining under the side edges of said projected portions, causing short-circuiting between said second interconnection layers through said conductive layer;

an eighth step for forming a second etching resist layer on said underlying interconnection layer, said second etching resist layer being provided between said second interconnection layers and at such a position as to cause said remaining conductive layer in said seventh step to be removed by an anisotropic etching method with said second etching resist layer as a mask, thereby preventing the short-circuiting between said second interconnection layers;

a ninth step for removing a part of said underlying interconnection layer by said anisotropic etching method with said etching resist layer as a mask, to finally form said first interconnection layer having substantially said given width; and a tenth step for removing said second etching resist layer formed in said eighth step.

2. A manufacturing method of semiconductor devices according to claim 1, wherein said projected portions include projections of predetermined width at each side of said first interconnection layer between said second interconnection layers having a predetermined longitudinal length equal to the distance between said second interconnection layers.

3. A manufacturing method of semiconductor devices according to claim 1, wherein said a projected portions include a projection of predetermined width at each side of said first interconnection layer, between said second interconnection layers having a predetermined longitudinal length smaller than the distance between said second interconnection layers.

4. A manufacturing method of semiconductor devices according to claim 1, wherein said projected portions include a first projection of first predetermined width at one side of said first interconnection layer and a second projection of second predetermined width at the other side thereof, said first projection having a longitudinal length equal to the distance between said second interconnection layers and said second projection having a longitudinal length smaller than the distance between said second interconnection layers.

5. A method of manufacturing semiconductor devices, wherein at least one first interconnection layer of a given width is formed on a first insulating layer and at least two second interconnection layers crossing the first interconnection layer are formed over a second insulating layer, the manufacturing method comprising:

a. laying down said first interconnection layer at a greater width than said given width at predetermined locations thus forming projecting portions on both sides of said given width;

b. etching said first insulating layer to a predetermined depth with said laid down first interconnection layer as a mask;

c. forming said second insulating layer covering the exposed surfaces of said laid down interconnection layer;

d. forming a conductive layer over the entire upper surface, including said first and second insulating layers, for forming from portions thereof said second interconnection layers;

e. covering said conductive layer with a first etching resist layer only in the areas defining said second interconnection layers;

f. etching by an anisotropic etching method said conductive layer with said first etching resist layer as a mask, producing said second interconnection layers;

g. removing said second insulating layer using said second interconnection layers as masks;

h. forming on said laid down first interconnection layer between said second interconnection layers a second etching resist layer of said given width, leaving exposed said projecting portions of said laid down first interconnection layer;

i. etching by an anisotropic etching method, with said second etching resist layer as a mask, said projecting portions of said laid down interconnection layer and any of said conductive layer remaining between said second interconnection layers after said anisotropical etching of said conductive layer; and j. removing said second etching resist layer.

6. A method of manufacturing semiconductor devices, as recited in claim 5, wherein said step of forming said second insulating layer covering the exposed surfaces of said laid down interconnection layer is performed by thermally oxidizing said laid down first interconnection layer.

7. A method of manufacturing semiconductor devices, as recited in claim 6, wherein at the edge of said laid down first interconnection layer said second insulating layer overhangs a gap between said first and second insulating layers.

8. A method of manufacturing semiconductor devices, as recited in claim 7, wherein the step of etching said first insulating layer to said predetermined depth etches said first insulating layer beneath the edges of said first interconnection layer to said predetermined depth.

9. A method of manufacturing semiconductor devices, as recited in any one of claim 5, 6, 7 and 8, wherein said projecting portions on both sides of said first interconnection layer are of predetermined width and have a predetermined longitudinal length equal to the distance between said second interconnection layers.

10. A method of manufacturing semiconductor devices, as recited in any one of claim 5, 6, 7, and 8, wherein said projecting portions on both sides of said first interconnection layer are of predetermined width and have a predetermined longitudinal length smaller than the distance between said second interconnection layers.

11. A method of manufacturing semiconductor devices, as recited in any one of claim 5, 6, 7, and 8, wherein said projecting portions include a first projection of a first predetermined width at one side of said first interconnection layer and a second projection of a second predetermined width at the other side thereof, said first projection having a longitudinal length equal to the distance between said interconnection layers and said second projection having a longitudinal length smaller than the distance between said second interconnection layers.

12. A manufacturing method of semiconductor devices according to claim 1 or 5, wherein said first insulating layer is provided on one of the main surfaces of a semiconductor substrate in a contact fashion.

13. A manufacturing method of semiconductor devices according to claim 1 or 5, wherein said first insulating layer is provided on the upper portion of a n-th level interconnection layer ($n \geq 1$) formed above one of the main surfaces of a semiconductor substrate.

* * * * *